US009223364B2

(12) United States Patent
Peng et al.

(10) Patent No.: US 9,223,364 B2
(45) Date of Patent: Dec. 29, 2015

(54) HEAT DISSIPATION CONTROL SYSTEM FOR PORTABLE ELECTRICAL DEVICE AND CONTROL METHOD THEREOF

(71) Applicant: Inhon International Co., Ltd, Taipei (TW)

(72) Inventors: Jing-Ting Peng, Taipei (TW); Cho-Yi Lin, Taipei (TW); Kuan-Chung Chen, Taipei (TW); Shun-Chi Yang, Taipei (TW)

(73) Assignee: INHON INTERNATIONAL CO., LTD., Taipei (TW)

( * ) Notice: Subject to any disclaimer, the term of this patent is extended or adjusted under 35 U.S.C. 154(b) by 518 days.

(21) Appl. No.: 13/690,726

(22) Filed: Nov. 30, 2012

(65) Prior Publication Data
US 2014/0121852 A1 May 1, 2014

Related U.S. Application Data

(60) Provisional application No. 61/718,540, filed on Oct. 25, 2012.

(51) Int. Cl.
| | |
|---|---|
| *G05D 23/00* | (2006.01) |
| *G05B 15/00* | (2006.01) |
| *B60H 1/00* | (2006.01) |
| *F22B 37/00* | (2006.01) |
| *F24F 7/00* | (2006.01) |
| *G06F 1/20* | (2006.01) |
| *H05K 7/20* | (2006.01) |
| *H05K 5/00* | (2006.01) |
| *H02P 5/00* | (2006.01) |
| *H02P 7/08* | (2006.01) |
| *H01L 29/18* | (2006.01) |
| *H01L 33/00* | (2010.01) |
| *F28F 13/14* | (2006.01) |
| *F28D 15/02* | (2006.01) |
| *G06F 1/16* | (2006.01) |
| *F28D 21/00* | (2006.01) |

(52) U.S. Cl.
CPC ............... *G06F 1/206* (2013.01); *F28D 15/02* (2013.01); *F28F 13/14* (2013.01); *G06F 1/1656* (2013.01); *G06F 1/203* (2013.01); *H05K 5/0017* (2013.01); *H05K 7/20409* (2013.01); *H05K 7/20436* (2013.01); *F28D 2021/0029* (2013.01)

(58) Field of Classification Search
CPC ............... G06F 1/20; G06F 1/16; F28F 7/00; F28D 15/04; F21V 7/04; F24F 7/00; H05K 5/00; H05K 5/20; H05K 7/20; H01L 33/08; H01L 33/58; H02P 7/08
USPC ......................................... 318/66; 257/88, 98
See application file for complete search history.

(56) References Cited

U.S. PATENT DOCUMENTS

| | | | | |
|---|---|---|---|---|
| 2006/0092607 | A1* | 5/2006 | Chien et al. | 361/687 |
| 2006/0138247 | A1* | 6/2006 | Shen et al. | 236/49.3 |
| 2012/0127652 | A1* | 5/2012 | Lin et al. | 361/679.46 |
| 2013/0081779 | A1* | 4/2013 | Liao et al. | 165/11.1 |

* cited by examiner

*Primary Examiner* — Mohammad Ali
*Assistant Examiner* — Md Azad
(74) *Attorney, Agent, or Firm* — Muncy, Geissler, Olds & Lowe, P.C.

(57) ABSTRACT

A heat dissipation control system includes an angle detection module and a control module. The heat dissipation control system is adapted for a portable electrical device having a first body and a second body. The angle detection module senses an included angle of the first body and the second body and generates an angle signal corresponding to the included angle of the first body and the second body. The control module, in response to the angle signal, generates a heat dissipation control signal according to the angle signal for enabling at least one of a first heat dissipation policy and a second heat dissipation policy.

15 Claims, 10 Drawing Sheets

HEAT DISSIPATION CONTROL SYSTEM FOR PORTABLE ELECTRICAL DEVICE AND CONTROL METHOD THEREOF

CROSS-REFERENCE TO RELATED APPLICATIONS

This non-provisional application claims priority under 35 U.S.C. §119(e) on Patent Application No(s). 61/718,540 filed in the United States on Oct. 25, 2012, the entire contents of which are hereby incorporated by reference.

BACKGROUND

1. Technical Field

The disclosure relates to a heat dissipation control system for portable electrical devices, and more particularly to a heat dissipation control system enabled by the angel of the components of the portable electrical devices.

2. Related Art

Slim laptops become prevailed recently. Users' behaviors have been changing due to implementing successfully of touch screen, and even the demarcation line is getting ambiguous between laptops and tablets. Various users' behavior affects designs in structures of the portable electrical devices. It is not only structures that get affected, but running status between laptop mode and tablet modes are under developed as well. Generally speaking, the display module and the host module may be adjusted with different included angles to ensure using ergonomically under various conditions. For example, under the tablet mode, the display module and the host module are in a close status for easy carrying or operating; while under the laptop mode, the display module and the host module operates under a predetermined included angle, in which both modules are in an open status.

However, the laptop mode and the tablet mode require different performances. Overall, when the device is used under the tablet mode, the software appliances require less performance and the system generates less heat than under the laptop mode. On the one hand, power saving is a main issue to users in using the portable device under the tablet mode may be used in different places. On the other hand, when the device is used under the laptop mode, the power can be supplied via a power source nearby. Therefore, the laptop mode and the tablet mode also require different power saving.

SUMMARY

The embodiment discloses a heat dissipation control system of a portable electrical device having a first body and a second body. The system comprises an angle detection module and a control module. The angle detection module senses an included angle of the first body and the second body and generates an angle signal corresponding to the included angle of the first body and the second body. The control module, in response to the angle signal, generates a heat dissipation control signal according to the angle signal for enabling at least one of a first heat dissipation policy and a second heat dissipation policy.

The embodiment further discloses a heat dissipation control method of a portable electrical device having a first body and a second body. The method comprises steps of sensing an included angle of the first body and the second body and generating an angle signal corresponding to the included angle of the first body and the second body; and in response to the angle signal, a heat dissipation control signal is generated based on the aforementioned angle signal for implementing at least one of a first heat dissipation policy and a second heat dissipation policy.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The detailed characteristics and advantages of the disclosure are described in the following embodiments in details, the techniques of the disclosure can be easily understood and embodied by a person of average skill in the art, and the related objects and advantages of the disclosure can be easily understood by a person of average skill in the art by referring to the contents, the claims and the accompanying drawings disclosed in the specifications.

Figure 1A:
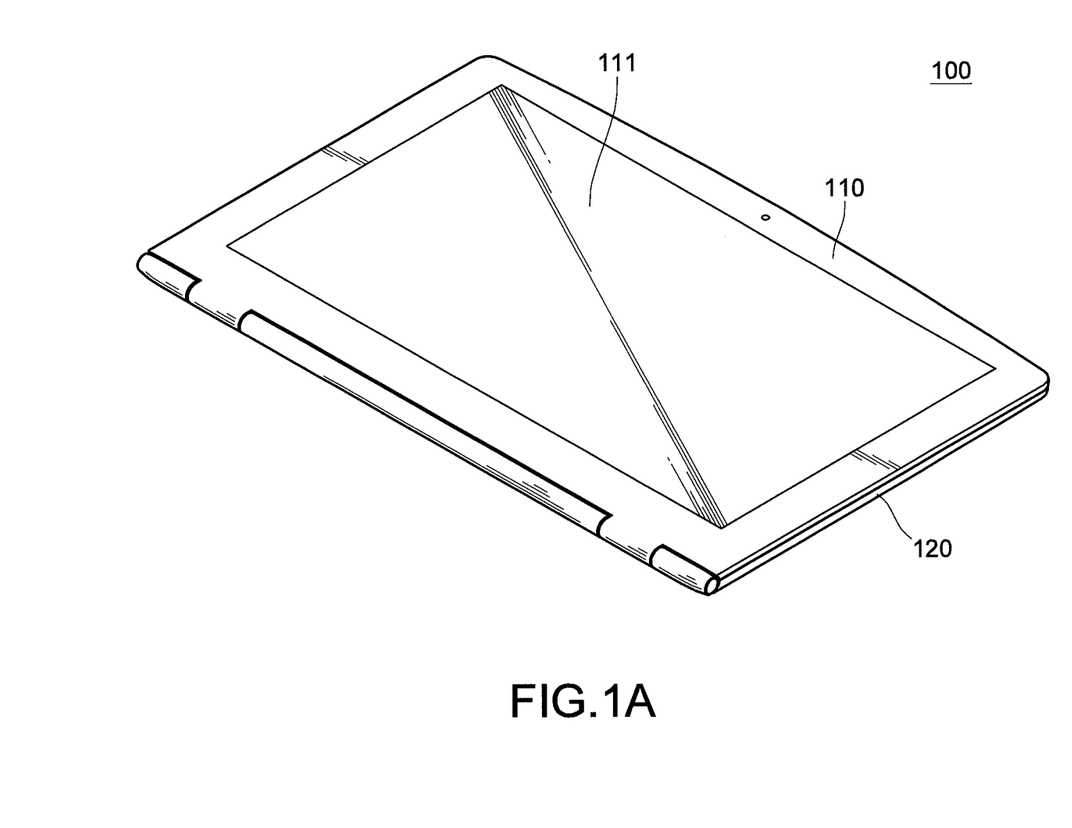
FIG. 1A and FIG. 1B illustrates the portable electrical device according to the embodiment of the disclosure.
Figure 1B:
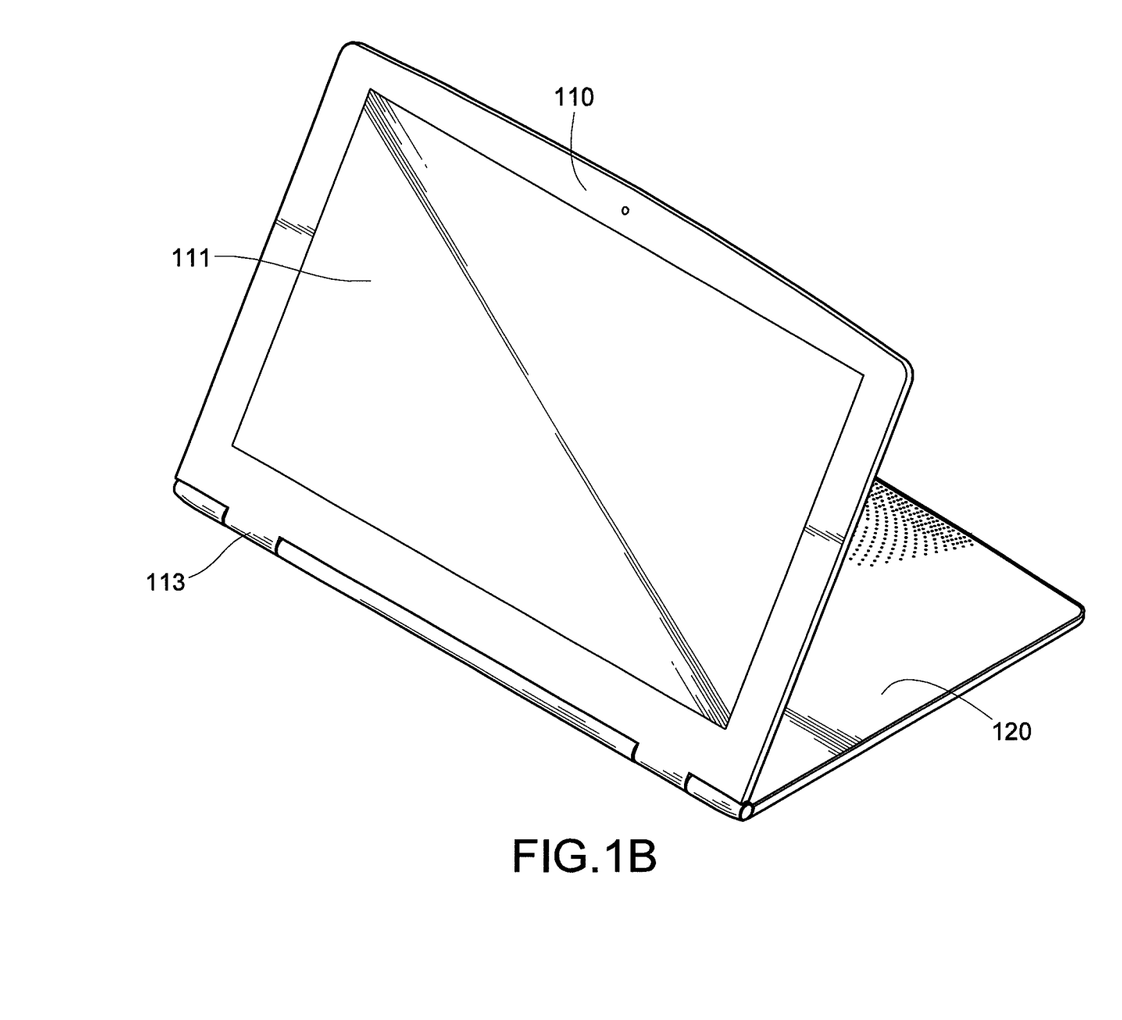

FIG. 1A and FIG. 1B illustrates the portable electrical device according to the embodiment of the disclosure. The portable electrical device 100 includes a first body 110 and a second body 120. The first body 110 is configured with a display module 111. In one embodiment, the first body 110 and the second body 120 are pivotally connected such that the first body 110 may move or rotate relative to the second body 120. Similarly, the second body 120 may move or rotate relative to the first body 110. In another embodiment, the first body 110 may be configured to move or rotate only relative to the second body 120. The display module 111 of the first body 110 may be equipped with a monitor for user's operation; the aforementioned monitor may be either a normal panel or a touch panel.

When the portable electrical device 100 is in a close status, as shown in FIG. 1A, the first body 110 and the second body 120 are contact with each other. When the device is in the close status, the included angle between the first body 110 and the second body 120 is zero degree. Thus, the included angle detected by the disclosed heat dissipation control system is zero degree. In another embodiment, the close status also may be determined substantially involving the conditions based on the detected included angle is close to zero degree, or a compact touch of the first body 110 and the second body 120. When the portable electrical device 100 is in an open status, as shown in FIG. 1B, the first body 110 and the second body 120 does not contact with each other. Thus, a non-zero degree of the included angle may be detected by the disclosed heat dissipation control system. In another embodiment, the open status also may be determined substantially involving the condition based on the open status of the first body 110 and the second body 120.

Figure 2:
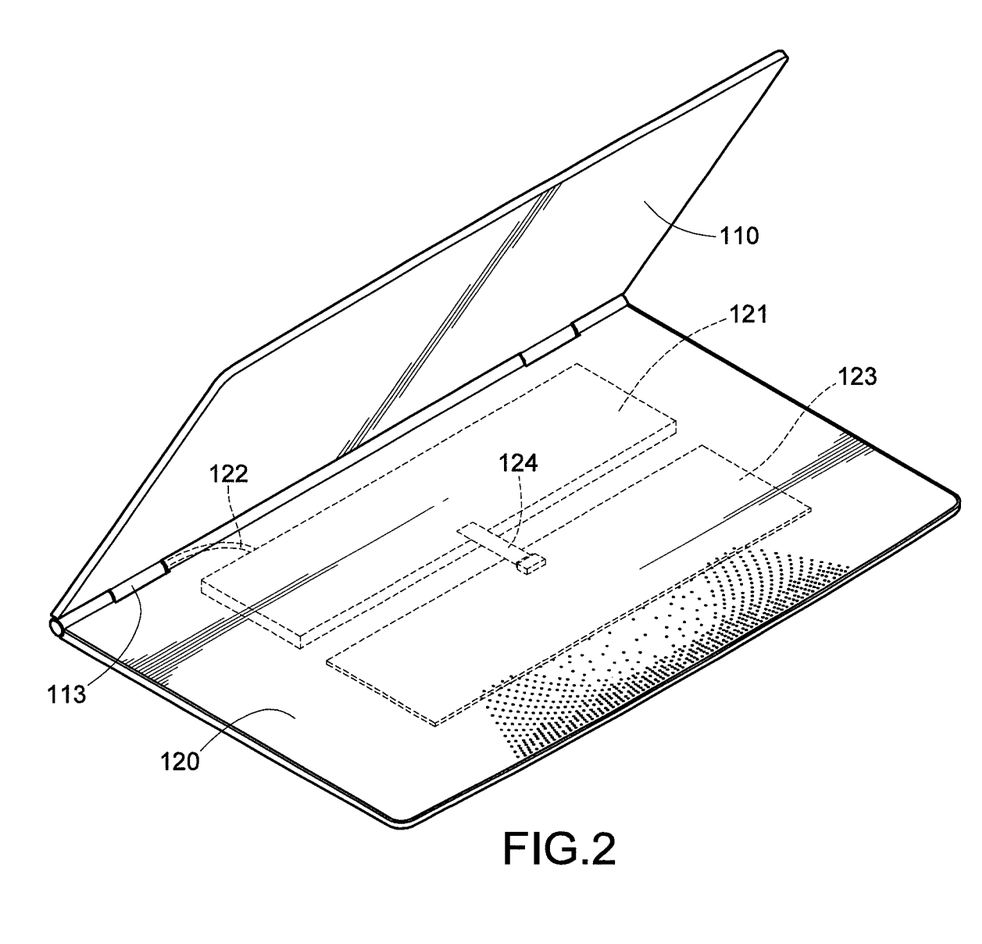
FIG. 2 illustrates the operation of the portable electrical device of FIG. 1 according to the embodiment of the disclosure.

FIG. 1B illustrates the operation of the portable electrical device 100 of FIG. 1A according to the embodiment of the disclosure, which is similar to the operation status of normal laptops. The first body 110 rotates through the pivot 113 such that the first body 110 does not contact with the second body 120. FIG. 2 shows the arrangement of the system of the portable electrical device 100. The second body 120 is further configured with a host system 121 used to control the display module 111 through the conduction line 122. An electrical power supply unit 123 is further configured in the second body 120. The electrical power supply unit 123 supplies electricity to the host system 121 and the display module 111 in the first body 110 through the conduction line 124. The host system 121 is illustrated by a single block, wherein including a central processor, a memory for storing permanent date, a memory for storing temporal data, a network module and other necessary modules, but not a module only.

Figure 3:
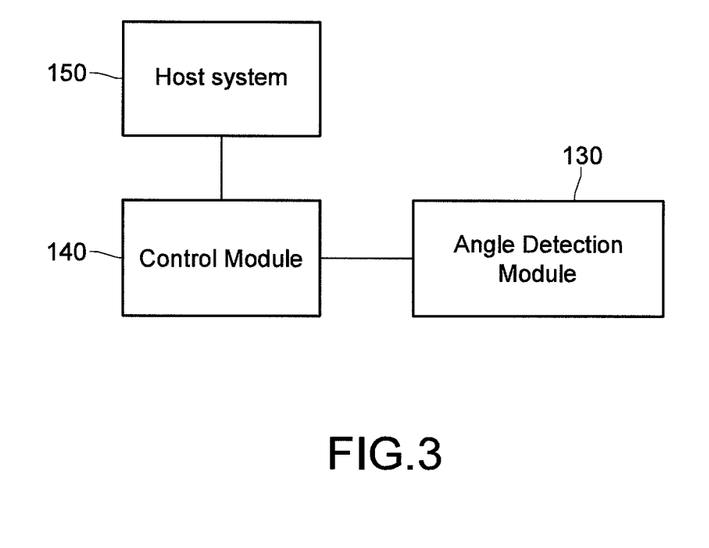
FIG. 3 illustrates the heat dissipation control system of the portable electrical device according to the embodiment of the disclosure.

FIG. 3 illustrates the heat dissipation control system of the portable electrical device 100 according to the embodiment of the disclosure. The heat dissipation control system of the portable electrical device 100 includes an angel detection module 130 and a control module 140. The components of the heat dissipation control system may be disposed in different bodies of the portable electrical device according to the practical need, which will be explained in the following paragraphs.

The angle detection module 130 senses an included angle between the first body 110 and the second body 120, and generates an angle signal corresponding to the included angle between the first body 110 and a second body 120. The control module 140 electrically connects to the angel detection module 130. The control module 140 generates a heat dissipation control signal corresponding to the angle signal in response to the angle signal from the angle detection module 130 such that at least one of the first heat dissipation policy and the second heat dissipation policy may be enabled. The first heat dissipation policy or the second heat dissipation are adopted for dissipating heat in the system or in the portable electrical device. The control module 140 electrically connects with the host system 150. The host system 150 is the host system as illustrated in FIG. 1. The host system 150 may be equipped with hardware, software or firmware to detect system temperature or to change the operation frequency of the central processor. Therefore, in one embodiment, the control module 140 generates a corresponding heat dissipation control signal in response to the control signal generated by the host system 150. The embodiment refers the temperature control signal to the control signal generated by the host system 150.

Generally, fans are adopted in a computer system for heat dissipation or lowering the operation frequency of the central processor. The embodiment adopts these measures as the first heat dissipation policy or the second heat dissipation policy.

For example, the first heat dissipation policy is to activate fans to dissipate heat generated by the system, while the second dissipation policy is to lower the operation frequency of the central processor.

In one embodiment, the angle signal detected by the angle detection module 130 may indicate the included angle between the first body and the second body is zero degree or close to zero degree, for example, the included angle from 0 degree to 30 degree may be categorized as close status. The angle signal may also indicate a close status of the first body and the second body or regard the first body and the second body as in a close status. In such conditions, the heat dissipation control signal generated by the control module 140 does not enable the first heat dissipation policy or the second heat dissipation policy. The heat dissipation module does not dissipate heat in such conditions. In one embodiment, he heat dissipation control signal generated by the control module 140 may also enable the second heat dissipation policy.

In one embodiment, the angle signal detected by the angle detection module 130 may indicate the included angle between the first body and the second body is not zero degree, or is not regarded as zero degree. The angle signal may also indicate an open status of a first body and a second body, or regard the first body and the second body as in an open status. The open status indicates that the first body and the second body does not contact with each other or may be not regarded as contacting with each other. The open status and the close status may be determined by the host system according to the detected included angle. In another embodiment, a first operation angle, a second operation angle, and a third operation angle are adopted to represent the included angle of the first body and the second body detected by the angle detection module. It is appreciated at least two operation angles to be defined at this disclosure, and more operation angles to be defined is applicable as well.

When the included angle of the first body 110 and the second body 120 detected by the angle detection module 130 is between the first operation angle and the second operation angle, for example, between 0 degree and 30 degree, the control module 140 generates the heat dissipation control signal to enable the first heat dissipation policy. When the temperature of the portable electrical device detected by an environmental thermal sensor is greater than a critical predetermined temperature, for example 105 degree, the heat dissipation control signal enables the second heat dissipation policy, and even the portable electrical device to activate turn off policy finally. In one embodiment, when the included angle of the first body 110 and the second body 120 detected by the angle detection module 130 is greater than the second operation angle, for example 30 degree, the heat dissipation control signal enables the second heat dissipation policy, which is to lower the operation frequency of the central processor.

The following paragraphs illustrate the embodiments of the angle detection module 130.

Figure 4:
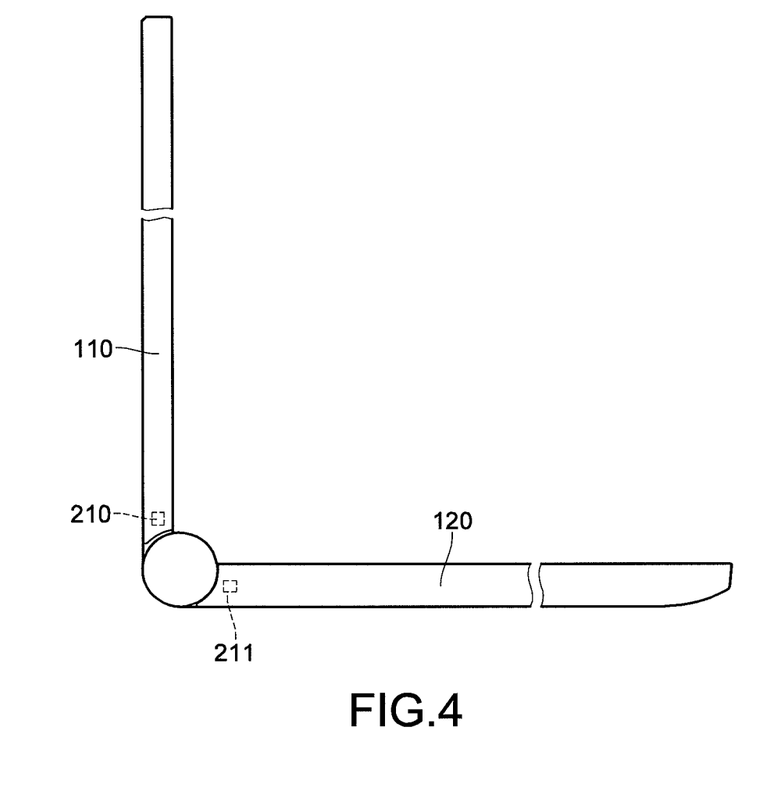
FIG. 4 illustrates the angle detection module according to the embodiment of the disclosure.

FIG. 4 illustrates the angle detection module 130 according to the embodiment of the disclosure. The angle detection module 130 includes an angle detector 210, and a position detection element 211. The angle detector 210 is arranged in the first body 110. The position detection element 211 is arranged in the second body 120. When the first body 110 moves relative to the second body 120, the position detection element 211 generates a corresponding position signal according to the relative position of the first body 110 and the second body 120. The angle detector 210 generates the angle signal in response to the position signal.

Figure 5:
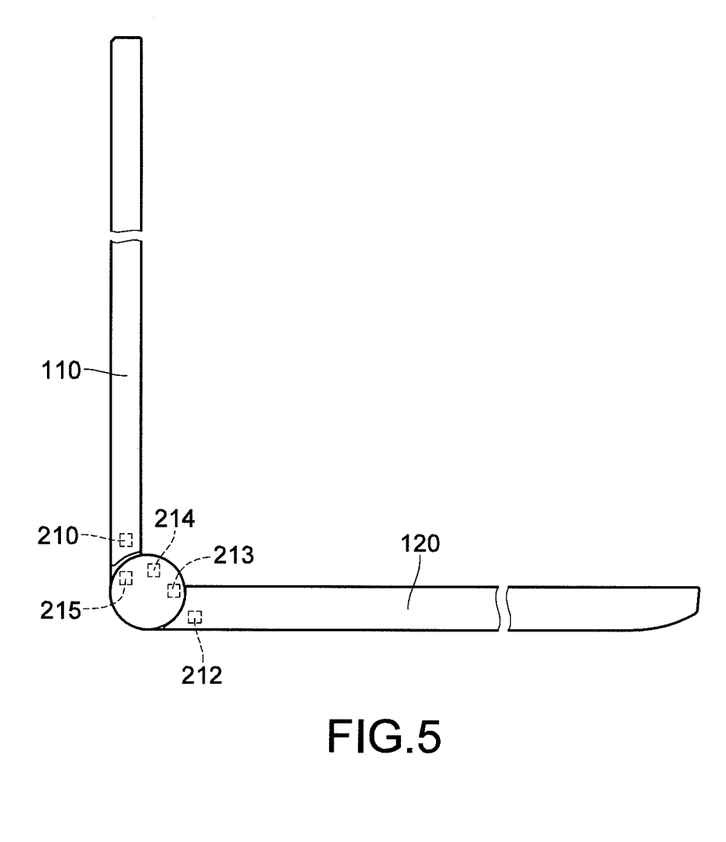
FIG. 5 illustrates the angle detection module according to another embodiment of the disclosure.

FIG. 5 illustrates the angle detection module 130 according to another embodiment of the disclosure. This embodiment is similar to the embodiment of FIG. 4. In this embodiment, various position detection elements 212, 213, 214 and 215 are adopted.

Figure 6:
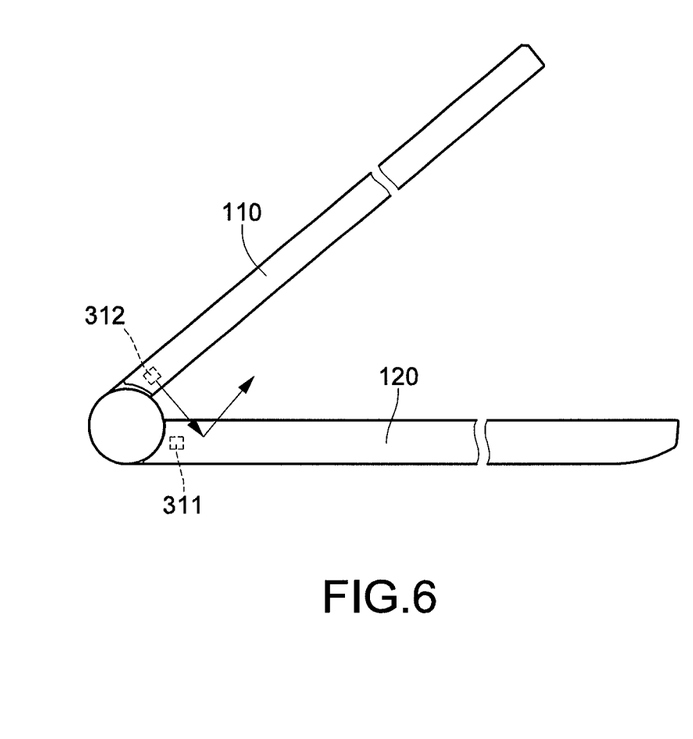
FIG. 6 illustrates the angle detection module according to another embodiment of the disclosure.

FIG. 6 illustrates the angle detection module 130 according to another embodiment of the disclosure. The angle detection module 130 includes a light emitting element 311, and an optical sensor 312. The light emitting element emits light ray. The optical sensor 312 is arranged in the second body 120 for sensing the light ray emitted from the light emitting unit. The optical sensor 312 generates the angle signal according to the sensed light ray.

Figure 7:
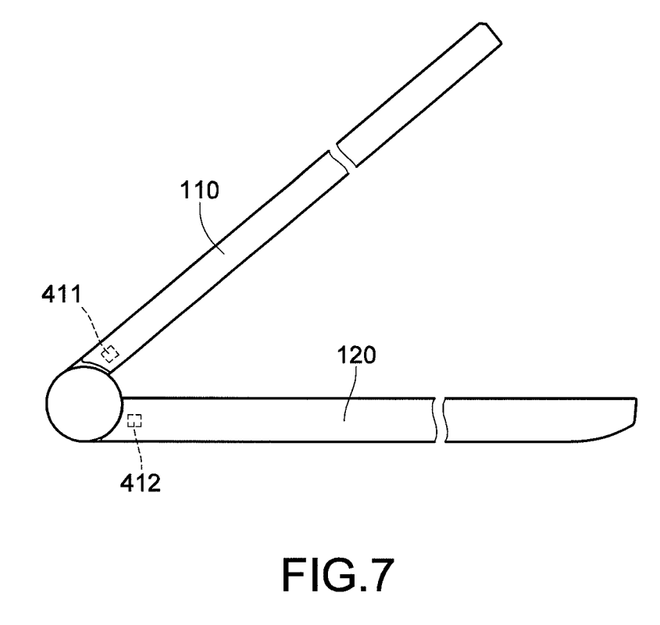
FIG. 7 illustrates the angle detection module according to another embodiment of the disclosure.

FIG. 7 illustrates the angle detection module 130 according to another embodiment of the disclosure. The angle detection module 130 includes a first sensor 411 and a second sensor 412. The first sensor 411 is arranged in the first body 110 for sensing a first angle signal or the rotated situation of the first body 110. The second sensor 412 is arranged in the second body 120 for sensing the second angle or the rotated situation of the first body 110. The angles information signals will be pass to the system 140 to calculate the included angle between the 110 and 120. In this embodiment, the control module 140 generates the heat dissipation control signal corresponding to the first angle signal detected by the first sensor 411 and the second angle signal detected by the second sensor 412.

In one embodiment, the first sensor 411 and the second sensor 412 are G-sensors. In another embodiment, the first sensor 411 and the second sensor 412 are motion sensors.

Figure 8:
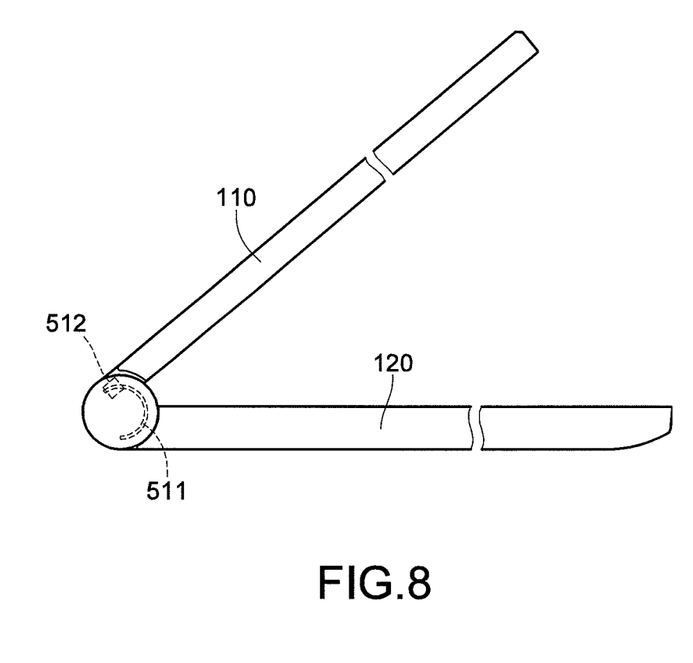
FIG. 8 illustrates the angle detection module according to another embodiment of the disclosure.

FIG. 8 illustrates the angle detection module 130 according to another embodiment of the disclosure. The angle detection module 130 includes a resistor 511 and a current detector 512. The resistor 511 is arranged in the first body 110 and the second body 120. When the first body 110 moves relative to the second body 120, the length of the resistor 511 varies with the relative position of the first body 110 and the second body 120. The current detector 512 detects a current on the resistor corresponding to the length of the resistor to generate the angle signal.

Figure 9:
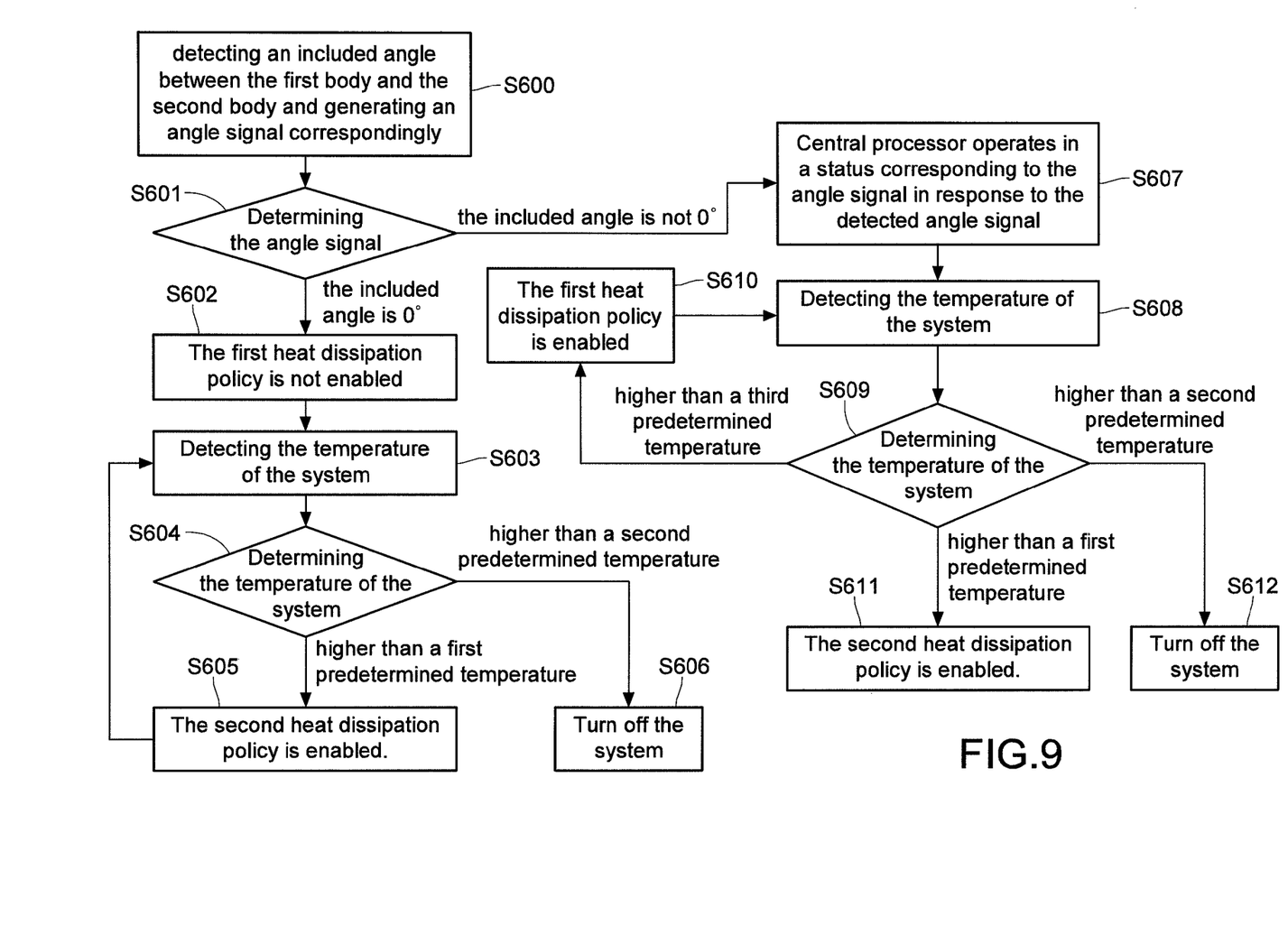
FIG. 9 illustrates the flow chart for controlling the heat dissipation control system of the portable electrical device according to the embodiment of the disclosure.

FIG. 9 illustrates the flow chart for controlling the heat dissipation control system of the portable electrical device according to the embodiment of the disclosure. According to the embodiment set forth, the control method hereinafter may be applied to a portable electrical device having a first body and a second body. In the disclosure, the heat dissipation is performed by the first heat dissipation policy and the second dissipation policy. For example, the first heat dissipation policy is to activate fans to dissipate heat, while the second heat dissipation policy is to lower the operation frequency of the central processor. Generally, the temperature of the central processor, or the system, is associated with the operation frequency. Thus, the temperature may be lowered by way of lowering the operation frequency such that the heat may be dissipated. The first heat dissipation policy and the second heat dissipation policy do not need to be enabled in sequence. Also, it is only for the convenience of illustration to refer the first heat dissipation policy to activate the fans, and refer the second heat dissipation policy to lower the frequency of central frequency. In one embodiment, more than two heat dissipation polices may also be adopted. For example, to turn off the system may also be defined as a heat dissipation policy.

First, the angle detection module detects an included angle between the first body and the second body and generates an angle signal correspondingly (step 600). The control module described in the embodiments set forth or the host system of the portable electrical device determines the angle signal (step 601). When the angle signal indicates the included angle of the first body and the second body is zero degree or close to zero degree, or the angle signal indicates a close status of the first body and the second body, the control module generates a heat dissipation control signal according to the angle signal. The heat dissipation control signal does not enable the first heat dissipation policy (step 602), that is to activate the fans.

Then the host system detects the temperature of the system (step 603) and determines the temperature of the system (Step 604). When the temperature detected by the host system is higher than a first predetermined temperature, for example 90 degrees Celsius, the host system generates a temperature control signal to the control module. The control module then generates a heat dissipation control signal in response the temperature control signal to enable the second heat dissipation policy, which is to lower the operation of the central processor (step 605). When the detected temperature is higher than a second predetermined temperature, for example 105 degrees Celsius, the host system generates a turn-off signal to turn off the system (step 606).

In one embodiment, since the angle signal indicates a close status of the first body and the second body, the first heat dissipation policy, which is to activate the fans, is not enabled in the method and the system of the disclosure. However, the temperature in the system may be too high while operating. Thus the temperature of the central processor or the temperature of the system is detected to determine whether to enable the second heat dissipation policy or to turn off the system. In such condition, the embodiment may refer turning-off the system to the third heat dissipation policy.

When the angle signal indicates the included angle between the first body and the second body is not zero degree, or indicates an open status of the first body and the second body, the first body and the second body does not be in contact. In such condition, the disclosure refers a first predetermined angle, a second predetermined angle, and a third predetermined angle to the included angle between the first body and the second body. It is appreciated that more predetermined angles may be defined. For example, the first predetermined angle is 30 degree, the second predetermined angle is 60 degree, and the third predetermined angle is 80 degree. The central processor may have various execution statuses according to the angle signals. Thus, according to the included angle between the first body and the second body, the central processor may operate in a first execution status in response to the first predetermined angle, in a second execution status in response to the second predetermined angle or in a third execution status in response to the third predetermined angle.

According to the afore-mentioned description, when the angle signal is not zero degree, the central processor may operate in a corresponding execution status according to the included angle between the first body and the second body detected by the angle detection module (step 607). For example, when the detected angle is 30 degree, which is referred to the first predetermined angle, the central processor operates in the first execution status. Then the system detects the temperature (step 608) and determines the temperature (step 609). When the detected temperature is higher than a third predetermined temperature, for example 60 degrees Celsius, the host system generates a temperature control signal to the control module. The control module generates a heat dissipation control signal in response to the heat dissipation control signal to enable the first heat dissipation policy (step 610), which is to activate the fans. Since the central processor may operate in the first, the second or the third execution status, the fans are also defined to operate in various rotation speed, for example, a first rotation speed in response to the first execution status, a second rotation speed in response to the second execution status, and a third rotation speed in response to the third execution status. In one embodiment, the first rotation speed may be 1500 RPM, the second rotation speed may be 3000 RPM, and the third rotation speed may be 4000 RPM. Similarly, when the detected temperature is higher than the first predetermined temperature, for example, 90 degree Celsius, the host system generates a temperature control signal to the control module. The control module generates the heat dissipation control signal in response to the temperature control signal such that the second heat dissipation policy is enabled (step 611), which is to lower the operation frequency of the central processor. When the detected temperature is higher than a second predetermined temperature, for example 105 degree Celsius, the host system generates a turn-off signal to turn off the system.

The execution status of the central processor is explained in the following paragraphs. In one embodiment, the execution status may be defined based on the consumption power of the central processor. For example, the consumption power of the first execution status is 8 Watts, the consumption power of the second execution status is 11 Watts, and the consumption power of the third execution status is 13 Watts. In another embodiment, for the central processor having various operation blocks, one block in the central processor operates in the first execution status, two blocks operates in the second execution status, and all blocks operate in the third execution status.

In another embodiment, the operation frequency central processors may be used to define the execution status. For example, the maximum frequency (P0) is 2300 MHz, the minimum frequency (Pn_max) is 800 MHz. There are two additional frequencies P1 and P2 in between, which are 2200 MHz and 2100 MHz respectively. The embodiment refers the operation frequency between Pn_max and P0 as the first execution status. The embodiment further refers the operation frequency between Pn_max and P2 as the second execution status, and refers the operation frequency between Pn_max and P1 as the third execution status.

The system and the method of the disclosure may be applied in a portable electrical device having a first body and a second body. When the first body and the second body are in a close status, the portable electrical device may be used as a tablet computer. When the first body and the second body are in an open status, the portable electrical device may be used as a general laptop. Therefore, through the arrangement of the angle detection module in the device to detect the included angle between the first body and the second body, a better heat dissipation policy may be determined according to the detected included angle or the system operation and temperature.

Note that the specifications relating to the above embodiments should be construed as exemplary rather than as limitative of the present invention, with many variations and modifications being readily attainable by a person skilled in the art without departing from the spirit or scope thereof as defined by the appended claims and their legal equivalents.

What is claimed is:

1. A heat dissipation control system of a portable electrical device having a first body and a second body, comprising:
    an angle detection module, sensing an included angle of the first body and the second body and generating an angle signal corresponding to the included angle of the first body and the second body, the angle detection module comprising:
    at least one position detection element arranged in the second body, wherein when the first body moves relative to the second body, the at least one position detection element generates a position signal corresponding to the relative position between the first body and the second body;
    a light emitting element emitting a light ray; and
    an optical sensor arranged in the second body for sensing the light ray, wherein the optical sensor generates the angle signal according to the sensed light ray; and
    an angle detector arranged in the first body, wherein the angle detector generates the angle signal in response to the position signal; and
    a control module, in response to the angle signal, generating a heat dissipation control signal according to the angle signal for enabling at least one of a first heat dissipation policy and a second heat dissipation policy.

2. The system of claim 1, wherein when the angle signal indicates the included angle of the first body and the second body is less than a first operation angle, the heat dissipation control signal does not enable the first heat dissipation policy.

3. The system of claim 2, wherein when the angle signal indicates the angle of the first body and the second body is between a first operation angle and a second operation angel, the heat dissipation control signal enables the first heat dissipation policy.

4. The system of claim 2, wherein when a temperature of the portable electrical device is greater than a predetermined temperature, the heat dissipation control signal enables the second heat dissipation policy.

5. The system of claim 2, wherein when the angle signal indicates the angle of the first body and the second body is greater than a second operation angle, the heat dissipation control signal enables the second heat dissipation policy.

6. A heat dissipation control method of a portable electrical device having a first body and a second body, comprising steps of:
    an angle detection module, sensing an included angle of the first body and the second body and generating an angle signal corresponding to the included angle of the first body and the second body, the angle detection module comprising:
    a light emitting element emitting a light ray; and
    an optical sensor arranged in the second body for sensing the light ray, wherein the optical sensor generates the angle signal according to the sensed light ray;
    a control module, in response to the angle signal, generating a heat dissipation control signal according to the angle signal for enabling at least one of a first heat dissipation policy and a second heat dissipation policy,
    when the angle signal indicates a first angle, the first heat dissipation policy is not executed and a system temperature is detected;
    when the system temperature is higher than a first temperature, executing the second heat dissipation policy and detect a system temperature again; and
    when the system temperature is higher than a second temperature, executing a third dissipation policy.

7. The method of claim 6, wherein the first heat dissipation policy is activating a fan in the portable electrical device.

8. The method of claim 6, wherein the second heat dissipation policy is lowering the frequency of a central processor of the portable electrical device.

9. The method of claim 6, wherein the third dissipation policy is turning off the portable electrical device.

10. The method of claim 6, wherein when the angle signal does not indicate the first signal, operating in at least one status and detecting the system temperature according to the angle signal.

11. The method of claim 10, comprising further steps of:
when the system temperature is higher than a predetermined temperature, enabling the first dissipation policy;
when the system temperature is higher than the first temperature, executing the second dissipation policy; and
when the system temperature is higher than a second temperature, executing the third dissipation policy.

12. The method of claim 11, wherein the first dissipation policy is activating a fan in the portable electrical device.

13. The method of claim 12, wherein the first dissipation further comprises setting the fan to a different rotation speed according to at least one condition.

14. The method of claim 11, wherein the second dissipation policy is reducing the frequency of a central processor of the portable electrical device.

15. The method of claim 14, wherein the second dissipation policy further comprises setting the central processor to different frequency according to at least one status.

* * * * *